US009463998B2

(12) United States Patent
Saitoh

(10) Patent No.: US 9,463,998 B2
(45) Date of Patent: Oct. 11, 2016

(54) MANUFACTURING METHOD FOR GLASS WITH FILM

(71) Applicant: NIPPON ELECTRIC GLASS CO., LTD., Otsu-shi, Shiga (JP)

(72) Inventor: Takayoshi Saitoh, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 141 days.

(21) Appl. No.: 14/364,305

(22) PCT Filed: Dec. 5, 2012

(86) PCT No.: PCT/JP2012/081460
§ 371 (c)(1),
(2) Date: Jun. 11, 2014

(87) PCT Pub. No.: WO2013/088998
PCT Pub. Date: Jun. 20, 2013

(65) Prior Publication Data

US 2014/0377461 A1 Dec. 25, 2014

(30) Foreign Application Priority Data

Dec. 16, 2011 (JP) ................................ 2011-275510

(51) Int. Cl.
*C23C 14/34* (2006.01)
*C23C 16/54* (2006.01)
(Continued)

(52) U.S. Cl.
CPC ............. *C03C 17/002* (2013.01); *C03C 17/09* (2013.01); *C03C 17/245* (2013.01); *C23C 14/0036* (2013.01); *C23C 14/541* (2013.01); *C23C 14/562* (2013.01); *C23C 16/46* (2013.01);
(Continued)

(58) Field of Classification Search
CPC ... C23C 16/54; C23C 16/545; C23C 16/448; C23C 14/34; C23C 14/56; C23C 14/562; C23C 16/34; C23C 16/40; C23C 16/06
See application file for complete search history.

(56) References Cited

U.S. PATENT DOCUMENTS 6,287,674 B1 * 9/2001 Verlinden ......... B32B 17/10018 257/E23.002
6,366,013 B1 * 4/2002 Leenders .......... B32B 17/10018 313/478

(Continued)

FOREIGN PATENT DOCUMENTS

CN 101680083 A 3/2010
CN 201999988 U 10/2011

(Continued)

OTHER PUBLICATIONS

Gordon, Roy, "Chemical vapor deposition of coatings on glass". Section 3. Glass coating at atmospheric Pressure. Journal of Non-Crystalline Solids, 218 (1997) 81-91.*

(Continued)

*Primary Examiner* — Bret Chen
(74) *Attorney, Agent, or Firm* — Keating and Bennett, LLP

(57) ABSTRACT

A method for manufacturing a film-coated glass film includes heating a cylindrical body made of glass or ceramic with a heater provided in an interior of the cylindrical body, heating a glass film by feeding the glass film over the heated cylindrical body, and forming a film made of an oxide, a nitride, or a metal on the glass film while the film is on and being heated by the cylindrical body.

13 Claims, 2 Drawing Sheets

30
1
II
22
10a
10
41
12
21b
C1
40
23
21
25b
25a
21a
20
43
44
42

(51) Int. Cl.

| | |
|---|---|
| ***C03C 17/00*** | (2006.01) |
| ***C23C 16/46*** | (2006.01) |
| ***C23C 14/54*** | (2006.01) |
| ***C23C 14/56*** | (2006.01) |
| ***C03C 17/09*** | (2006.01) |
| ***C03C 17/245*** | (2006.01) |
| ***C23C 14/00*** | (2006.01) |

(52) U.S. Cl.

CPC ......... *C23C16/545* (2013.01); *C03C 2217/21* (2013.01); *C03C 2217/25* (2013.01); *C03C 2217/948* (2013.01); *C03C 2218/152* (2013.01); *C03C 2218/154* (2013.01)

(56) References Cited

U.S. PATENT DOCUMENTS

| | | | | |
|---|---|---|---|---|
| 2002/0031382 | A1* | 3/2002 | Yura | G03G 15/2053 399/330 |
| 2002/0142621 | A1* | 10/2002 | Wang | C23C 16/4481 438/765 |
| 2003/0035667 | A1 | 2/2003 | Izawa et al. | |
| 2003/0146709 | A1 | 8/2003 | Ohta et al. | |
| 2004/0219450 | A1* | 11/2004 | Nagate | G03C 1/74 430/199 |
| 2005/0181130 | A1* | 8/2005 | Thomsen | C03C 17/22 427/249.7 |
| 2006/0113898 | A1* | 6/2006 | Toyoda | B41J 2/45 313/504 |
| 2006/0204772 | A1 | 9/2006 | Mukunoki et al. | |
| 2006/0288935 | A1* | 12/2006 | Kato | C23C 16/24 118/715 |
| 2007/0012676 | A1* | 1/2007 | Koide | H05B 3/0095 219/216 |
| 2007/0071516 | A1* | 3/2007 | Nuita | G03G 15/2064 399/329 |
| 2007/0122936 | A1* | 5/2007 | Park | H01L 21/67109 438/77 |
| 2009/0044900 | A1* | 2/2009 | Suehara | B32B 38/10 156/239 |
| 2009/0078365 | A1* | 3/2009 | Suehara | B32B 37/223 156/249 |
| 2009/0176038 | A1* | 7/2009 | Komori | C03B 17/06 428/1.1 |
| 2010/0021727 | A1 | 1/2010 | Nakamura et al. | |
| 2010/0055311 | A1 | 3/2010 | Hirono et al. | |
| 2010/0147677 | A1 | 6/2010 | Pinarbasi et al. | |
| 2010/0260964 | A1 | 10/2010 | Nakamura et al. | |
| 2011/0030794 | A1 | 2/2011 | Teng | |
| 2011/0064958 | A1 | 3/2011 | Hirose | |
| 2011/0177325 | A1* | 7/2011 | Tomamoto | B65H 18/28 428/332 |
| 2012/0131955 | A1 | 5/2012 | Kuroiwa et al. | |
| 2016/0083282 | A1* | 3/2016 | Jouanno | B32B 17/061 156/102 |

FOREIGN PATENT DOCUMENTS

| | | | |
|---|---|---|---|
| CN | 102271909 | A | 12/2011 |
| JP | 59-177364 | A | 10/1984 |
| JP | 63-277750 | A | 11/1988 |
| JP | 1-222050 | A | 9/1989 |
| JP | 01-240659 | A | 9/1989 |
| JP | 2003-45615 | A | 2/2003 |
| JP | 2003-161817 | A | 6/2003 |
| JP | 2007-119322 | A | 5/2007 |
| TW | 201111308 | A1 | 4/2011 |
| WO | 2011/016352 | A1 | 2/2011 |

OTHER PUBLICATIONS

Izu, M., et al., "Continuous Roll-to-Roll Serpentine Deposition for high throughput a-Si PV Manufacturing". IEEE, First WCPEC, Hawaii; Dec. 5-9, 1994, pp. 820-823.*

Ludwig, Rainer, et al., "Vacuum Web Coating—State of the Art and Potential for Electronics". Proceedings of the IEEE, vol. 93, No. 8, Aug. 2005, pp. 1483-1490.*

Official Communication issued in corresponding European Patent Application No. 12857902.6, mailed on Apr. 28, 2015.

Official Communication issued in International Patent Application No. PCT/JP2012/081460, mailed on Mar. 19, 2013.

* cited by examiner

MANUFACTURING METHOD FOR GLASS WITH FILM

TECHNICAL FIELD

This invention relates to a film forming device and a method for manufacturing a film-coated glass film using the device.

BACKGROUND ART

Recently, there are demands to form a film on the top of a flexible glass film. For example, Patent Literature 1 describes a method in which a glass sheet fed from a substrate roll is heated with a can heated to 300° C. or above and an ITO (indium-tin oxide) film is formed on a surface of the heated glass sheet on the can by sputtering.

CITATION LIST

Patent Literature

Patent Literature 1: JP-A-2007-119322

SUMMARY OF INVENTION

Technical Problem

However, in the method described in Patent Literature 1, metal is used as a material of the can. In order to reduce that the surface of the metallic can coming into contact with the glass sheet and heated to a high temperature is oxidized and thereby altered or degraded, it is necessary to form a film with the can placed in an inert gas atmosphere. Hence, the film forming device is increased in size and the cost for film formation rises. Particularly, in the case of applying the film forming device to a thermal CVD device requiring higher temperatures than sputtering, the surface of the metallic can is more likely to be oxidized.

An object of the present invention is to provide a device capable of suitably forming a film on a glass film.

Solution to Problem

A film forming device according to the present invention includes a heating roll and a film forming unit. The heating roll has a surface onto which a glass film is to be fed. The heating roll is configured to heat the glass film. The film forming unit is configured to forma film on the glass film. The heating roll includes a cylindrical body and a heater. The cylindrical body is made of glass or ceramic. The cylindrical body is rotatably provided. The heater is disposed in an interior of the cylindrical body. The heater is configured to heat the cylindrical body.

The cylindrical body is preferably made of at least one selected from the group consisting of quartz glass, crystallized glass, alumina, silica, silicon nitride, and silicon carbide.

The film forming device according to the present invention preferably further includes a feed unit located between the cylindrical body and the glass film and configured to feed a sheet whose surface layer next to the glass film has a lower hardness than the glass film.

The sheet is preferably made of metal.

The sheet preferably has one to ten times the coefficient of thermal expansion of the glass film.

The heater may be disposed to heat a portion of the cylindrical body coming into contact with the glass film.

The heater is preferably configured to emit heat rays toward the cylindrical body. In this case, the film forming device according to the present invention preferably further includes an absorbing layer disposed on an inner peripheral surface of the cylindrical body and capable of absorbing heat rays emitted from the heater.

The film forming unit may be constituted by a reactive gas supply unit configured to supply a reactive gas capable of thermally reacting on the glass film to form a film thereon or a sputtering unit configured to deposit sputtered particles on the glass film.

In a method for manufacturing a film-coated glass film according to the present invention, a film is formed on the glass film using the film forming device according to the present invention.

The film may be formed by thermal CVD or sputtering.

Advantageous Effects of Invention

In the present invention, a device capable of suitably forming a film on a glass film can be provided.

DESCRIPTION OF EMBODIMENTS

Figure 1:
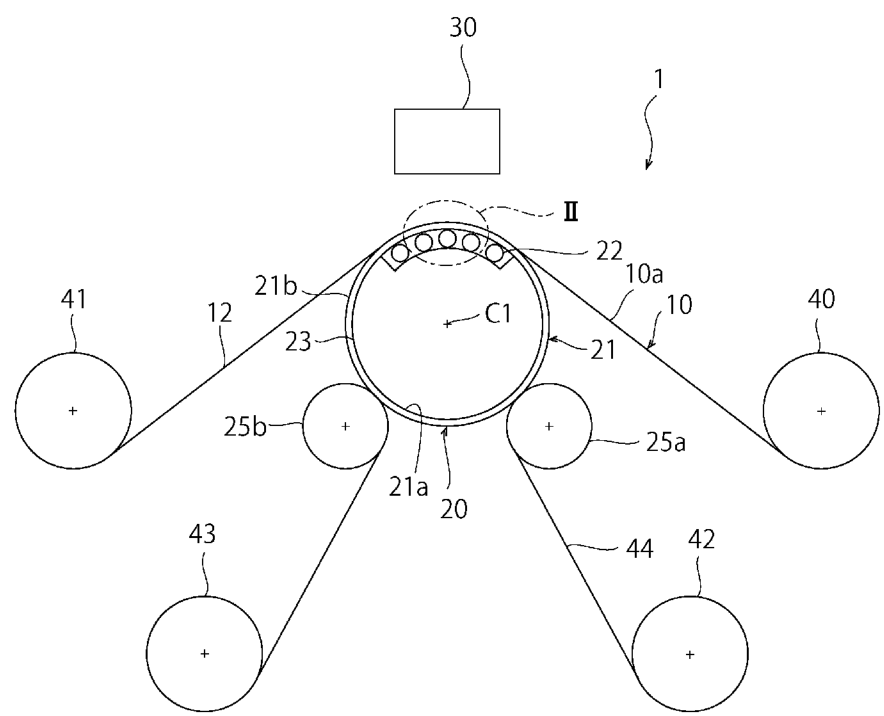
FIG. 1 is a schematic side view of a film forming device in one embodiment of the present invention.

A description will be given below of an example of a preferred embodiment for working of the present invention. However, the following embodiment is simply illustrative. The present invention is not at all limited by the following embodiment.

The drawings to which the embodiment and the like refer are schematically illustrated, and the dimensional ratios and the like of objects illustrated in the drawings may be different from those of the actual objects. Different drawings may have different dimensional ratios and the like of the objects. Dimensional ratios and the like of specific objects should be determined in consideration of the following description.

Figure 3:
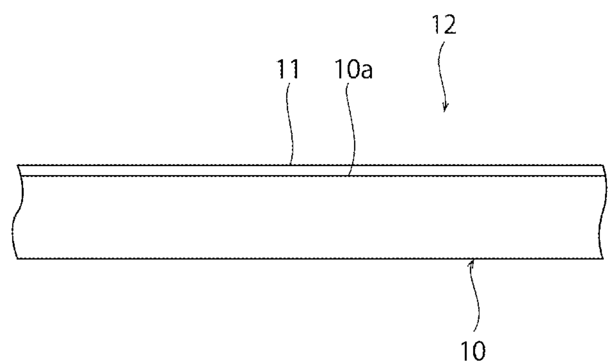
FIG. 3 is a schematic side view of a film-coated glass film manufactured in the one embodiment of the present invention.

FIG. 1 is a schematic side view of a film forming device 1 in this embodiment. The film forming device 1 is a device for forming a film 11 (see FIG. 3) on a surface 10*a* of a flexible glass film 10 to produce a film-coated glass film 12 including the glass film 10 and the film 11.

No particular limitation is placed on the thickness of the glass film 10 so long as the glass film 10 has flexibility. The thickness of the glass film 10 is, for example, preferably not greater than 300 μm, more preferably not greater than 100 μm, and still more preferably not greater than 50 μm.

No particular limitation is placed on the type of glass forming the glass film 10. The glass film 10 may be made of, for example, silicate glass, borate glass or phosphate glass. In the present invention, examples of the glass film include a crystallized glass film made of crystallized glass.

No particular limitation is placed on the type of the film 11. The film 11 may be made of an oxide, such as tin oxide, indium oxide, silicon oxide, titanium oxide, niobium oxide, tantalum oxide or lanthanum oxide; a nitride, such as silicon nitride or titanium nitride; or a metal, such as silicon, silver, copper or aluminum.

The film forming device 1 includes a heating roll 20. The heating roll 20 includes a cylindrical body 21 and a heater 22. The cylindrical body 21 is supported rotatably about a central axis C1 by a core 23 held against rotation into the cylindrical body 21. The cylindrical body 21 is capable of rotating about the central axis C1 together with the rotation of rotary rolls 25*a*, 25*b*.

The cylindrical body 21 is made of glass or ceramic. Specific examples of the glass preferably used as a constituent material of the cylindrical body 21 include quartz glass and crystallized glass. Specific examples of the ceramic preferably used as a constituent material of the cylindrical body 21 include alumina, silica, silicon nitride, and silicon carbide.

No particular limitation is placed on the outside diameter of the cylindrical body 21. The outside diameter of the cylindrical body 21 can be, for example, about 100 mm to about 2000 mm. The thickness of the cylindrical body 21 is, for example, preferably about 3 mm to about 20 mm. If the thickness of the cylindrical body 21 is too small, the strength of the cylindrical body 21 may be low. If the thickness of the cylindrical body 21 is too large, the heat capacity of the cylindrical body 21 will be large. This needs to give the cylindrical body 21 large energy for the purpose of heating it or maintaining its temperature and may make it difficult to control the temperature of the glass film.

The heater 22 is disposed in the interior of the cylindrical body 21. Specifically, the heater 22 is disposed in a cutaway formed in the core 23 to face the inner peripheral surface 21*a* of the cylindrical body 21. More specifically, the heater 22 is disposed facing a portion of the cylindrical body 21 coming into contact with the glass film 10 and thus configured to heat the portion of the cylindrical body 21 coming into contact with the glass film 10.

Figure 2:
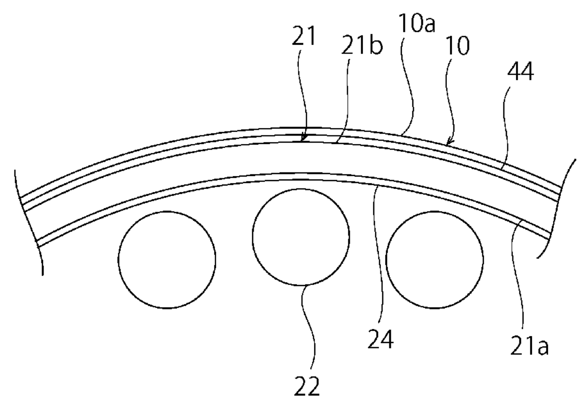
FIG. 2 is an enlarged schematic side view of the portion II of FIG. 1.

No particular limitation is placed on the type of the heater 22 so long as it can heat the cylindrical body 21 to a temperature at which a film 11 can be formed on the surface 10*a* of the glass film 10. The heater 22 may be formed of, for example, an infrared heater or near-infrared heater configured to emit heat rays toward the cylindrical body 21. In this case, as shown in FIG. 2, an absorbing layer 24 capable of absorbing heat rays emitted from the heater 22 is preferably disposed on the inner peripheral surface 21*a* of the cylindrical body 21. Thus, the heating efficiency of the cylindrical body 21 can be increased.

The absorbing layer 24 can be made of, for example, a black body paint containing, as a pigment, graphite, iron, manganese or the like.

A film forming unit 30 is disposed above the cylindrical body 21 opposite to the heater 22 with the cylindrical body 21 in between. The film forming unit 30 is configured to form a film 11 on the surface 10*a* of the glass film 10.

The film forming unit 30 can be appropriately constituted according to the film forming method. For example, in forming a film 11 on the surface 10*a* of the glass film 10 by thermal CVD (chemical vapor deposition), the film forming unit 30 can be constituted by a reactive gas supply unit configured to supply a reactive gas capable of thermally reacting on the glass film 10 to form a film 11 thereon. For another example, in forming a film 11 on the surface 10*a* of the glass film 10 by sputtering, the film forming unit 30 can be constituted by a sputtering unit configured to deposit sputtered particles on the glass film 10.

The film forming device 1 is provided with a glass film feed roll 40 and a take-up roll 41. The glass film feed roll 40 is configured to feed a yet-to-be-coated glass film 10 onto the outer peripheral surface 21*b* of the cylindrical body 21. The take-up roll 41 is configured to take up a film-coated glass film 12 which includes the glass film 10 and a film 11 formed on the surface 10*a* of the glass film 10.

The film forming device 1 is further provided with a sheet feed roll 42 and a sheet take-up roll 43. The sheet feed roll 42 is configured to feed a buffer film 44 to between the outer peripheral surface 21*b* of the cylindrical body 21 and the glass film 10. The sheet take-up roll 43 is configured to take up the buffer film 44 discharged from between the outer peripheral surface 21*b* of the cylindrical body 21 and the glass film 10.

The buffer film 44 is formed of a sheet whose surface layer next to the glass film 10 has a lower hardness than the glass film 10. The buffer film 44 can be made of, for example, at least one metal of aluminum, iron, copper, and so on. In other words, the buffer film 44 can be constituted by a metal film.

As described above, in the film forming device 1, a buffer film 44 is fed to between the high-hardness cylindrical body 21 made of glass or ceramic and the glass film 10. Therefore, it can be effectively prevented that the surface of the glass film 10 is scratched by the contact of the glass film 10 with the cylindrical body 21.

If the buffer film 44 is one capable of reflecting or absorbing heat rays from the heater 22, the heating efficiency of the cylindrical body 21 can be further increased.

The thickness of the buffer film 44 is, for example, preferably about 10 μm to about 100 μm. The buffer film 44 preferably has about one to about ten times the coefficient of thermal expansion of the glass film.

Next, a description will be given of a method for manufacturing a film-coated glass film 12 using the film forming device 1.

A glass film 10 is fed from the glass film feed roll 40 onto the outer peripheral surface 21*b* of the cylindrical body 21. A buffer film 44 is fed from the sheet feed roll 42 to between the glass film 10 and the outer peripheral surface 21*b* of the cylindrical body 21. Thus, the contact between the cylindrical body 21 and the glass film 10 is restricted.

With the feeding of the glass film 10 and the buffer film 44, the cylindrical body 21 is driven into rotation by the rotary rolls 25*a*, 25*b*. This reduces the friction between the glass film 10 and the buffer film 44 and the friction between the buffer film 44 and the cylindrical body 21.

The glass film 10 fed onto the outer peripheral surface 21*b* of the cylindrical body 21 is heated by the heating roll 20. Specifically, the heater 22 heats the cylindrical body 21 and the heated cylindrical body 21 heats the glass film 10 to a temperature suitable for film formation.

A film 11 is formed on the surface 10*a* of the heated glass film 10, such as by sputtering or thermal CVD, using the film forming unit 30, resulting in the production of a film-coated glass film 12. The produced film-coated glass film 12 is taken up by the take-up roll 41. Meanwhile, the buffer film 44 is taken up by the take-up roll 43. In taking up the film-coated glass film 12, the buffer film 44 may be taken up together with the film-coated glass film 12. Furthermore, together with the film-coated glass film 12, a film different from the buffer film 44, for example, a film made of paper or resin, may be taken up. This prevents damage to the film-coated glass film 12 caused by the contact between portions of the film-coated glass film 12.

As thus far described, in this embodiment, the outer peripheral surface of the heating roll 20 coming into contact with the glass film 10 is formed by the cylindrical body 21 made of glass or ceramic. Therefore, even if oxygen is present in an atmosphere for film formation, the surface of the heating roll 20 coming into contact with the glass film 10 cannot be oxidized. Hence, the change in the profile of a surface of the glass film 10 next to the heating roll 20 can be reduced. Furthermore, since there is no need to additionally provide any means for reducing the oxidation of the surface of the heating roll 20, the structure of the film forming device 1 can be simplified, resulting in reduced cost for producing a film-coated glass film 12.

For example, with the use of a can, it takes a long time to raise the can to a temperature suitable for film formation. In addition, in order to maintain the can with high heat capacity at a high temperature, a significant amount of energy is required. In contrast, in this embodiment, it is sufficient if the cylindrical body 21 with small heat capacity is heated. Therefore, it takes a short time to raise the heating roll to a temperature suitable for film formation. Furthermore, since it is sufficient if only a portion of the cylindrical body 21 coming into contact with the glass film 10 is maintained at a temperature suitable for film formation, this is advantageous in terms of energy efficiency.

REFERENCE SIGNS LIST

1 . . . film forming device
10 . . . glass film
10*a* . . . surface
11 . . . film
12 . . . film-coated glass film
20 . . . heating roll
21 . . . cylindrical body
21*a* . . . inner peripheral surface
21*b* . . . outer peripheral surface
22 . . . heater
23 . . . core
24 . . . absorbing layer
25*a*, 25*b* . . . rotary roll
30 . . . film forming unit
40 . . . glass film feed roll
41 . . . take-up roll
42 . . . sheet feed roll
43 . . . sheet take-up roll
44 . . . buffer film

The invention claimed is:

1. A method for manufacturing a film-coated glass film, the method comprising the steps of:
- heating a cylindrical body made of glass or ceramic with a heater provided in an interior of the cylindrical body;
- heating a glass film by feeding the glass film over and in contact with the heated cylindrical body; and
- forming a film made of an oxide, a nitride, or a metal on the glass film while the film is on and being heated by the cylindrical body.

2. The method for manufacturing a film-coated glass film according to claim 1, wherein the step of forming the film includes thermal CVD or sputtering.

3. The method for manufacturing a film-coated glass film according to claim 1, wherein the cylindrical body is made of at least one selected from the group consisting of quartz glass, crystallized glass, alumina, silica, silicon nitride, and silicon carbide.

4. The method for manufacturing a film-coated glass film according to claim 1, wherein the step of heating the glass film includes heating a portion of the cylindrical body that comes into contact with the glass film.

5. The method for manufacturing a film-coated glass film according to claim 1, wherein the step of heating the glass film includes emitting heat rays toward the cylindrical body.

6. The method for manufacturing a film-coated glass film according to claim 5, wherein the cylindrical body includes an absorbing layer disposed on an inner peripheral surface that absorbs the heat rays.

7. The method for manufacturing a film-coated glass film according to claim 1, wherein the step of forming the film includes supplying a reactive gas that thermally reacts with the glass film to form the film on the glass film, or depositing sputtered particles on the glass film to form the film on the glass film.

8. The method for manufacturing a film-coated glass film according to claim 1, wherein the cylindrical body is driven to rotate with the feeding of the glass film.

9. The method for manufacturing a film-coated glass film according to claim 1, wherein the glass film is flexible.

10. The method for manufacturing a film-coated glass film according to claim 1, wherein the heater is disposed in a cutaway of a core provided in the cylindrical body and to face an inner peripheral surface of the cylindrical body.

11. A method for manufacturing a film-coated glass film, the method comprising the steps of:
- heating a cylindrical body made of glass or ceramic with a heater provided in an interior of the cylindrical body;
- feeding a sheet between the cylindrical body and a glass film;
- heating the glass film by feeding the glass film over and in contact with the heated cylindrical body through the sheet; and
- forming a film made of an oxide, a nitride, or a metal on the glass film while the film is on and being heated by the cylindrical body; wherein
- a surface layer of the sheet next to the glass film has a hardness lower than a hardness of the glass film.

12. The method for manufacturing a film-coated glass film according to claim 11, wherein the sheet is made of metal.

13. The method for manufacturing a film-coated glass film according to claim 11, wherein a coefficient of thermal expansion of the sheet is one to ten times a coefficient of thermal expansion of the glass film.

* * * * *